Jan. 13, 1959 R. N. NOYCE 2,869,055

FIELD EFFECT TRANSISTOR

Filed Sept. 20, 1957

INVENTOR.
ROBERT N. NOYCE
BY
Flehr and Swain

United States Patent Office 2,869,055

Patented Jan. 13, 1959

2,869,055

FIELD EFFECT TRANSISTOR

Robert N. Noyce, Los Altos, Calif., assignor to Beckman Instruments, Inc., Fullerton, Calif., a corporation of California

Application September 20, 1957, Serial No. 685,305

8 Claims. (Cl. 317—235)

This invention relates generally to field effect transistors and more particularly to field effect transistors suitable for operation at relatively high frequencies.

It is a general object of the present invention to provide an improved field effect transistor.

It is another object of the present invention to provide a field effect transistor in which the depletion or space charge layer is formed to give a channel having a relatively uniform width.

It is another object of the present invention to provide a field effect transistor in which pinch-off occurs at the source end of the channel at substantially the same time or sooner than at the drain end.

These and other objects of the invention will become more clearly apparent from the following description taken in conjunction with the accompanying drawing.

Referring to the drawing.

Figure 6:
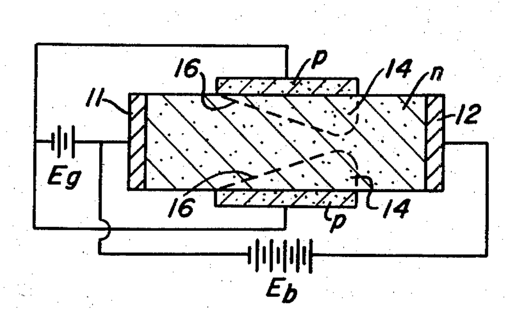
Figure 6 shows a conventional field effect transistor.

In Figure 6 a field effect transistor in accordance with the prior art is illustrated. The transistor comprises an n-type channel region with p-type gate regions forming junctions therewith. Ohmic contacts 11 and 12 are made at opposite ends of the channel region. A voltage $E_b$ is applied between the source contact 11 and the drain contact 12. Carriers drift from the source to the drain in the channel under the influence of the longitudinal field. When the p-type gate regions have a negative voltage applied thereto, a space charge region 14 is formed adjacent thereto. Because of the variation of voltage $E_b$ between the source and drain, the space charge region has a configuration generally as shown by the dotted lines 16. Thus, it is seen that when the negative voltage applied to the gate regions is increased, the effective channel is pinched off at the drain end.

With uniform doping density and channel width the frequency response decreases as the gate bias $E_g$ is increased. This is generally because the field in the channel varies approximately as the difference between pinch-off voltage and gate bias voltage. It decreases as the gate bias voltage increases. As a consequence, the transit time of the electrons drifting from source to drain is increased and the frequency response of the transistor is decreased.

Figure 1:
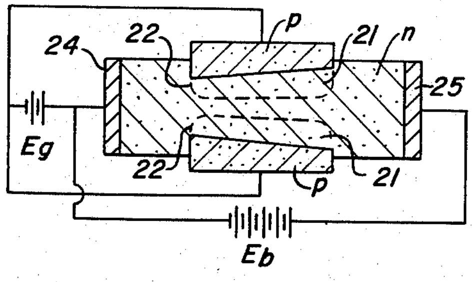
Figure 1 shows a field effect transistor incorporating the invention.

Referring now to Figure 1, a gate configuration which tends to overcome this is shown. The n-type channel region has a pair of p-type gates forming junctions therewith. The n-type region between the gates increases in width from source to drain. This increase in width is selected to correspond to the increase in width of the space charge layer 21, previously described. The space charge or depletion layers approach one another to form an effective channel which has a relatively uniform width, as indicated by the dotted lines 22. In fact, the region may be made such that the transistor is pinched off (depletion layers extends across the channel) at the source end 24 before it is pinched off at the drain end 25. Gate and drain voltages are applied as previously described.

With the gate pinched off at the source end, a field is maintained in the channel by applying a suitable bias to the drain electrode 25. The transit time remains short near the pinch-off value of gate bias rather than approaching infinity as is the usual case with the type of transistor illustrated in Figure 6.

Figure 2:
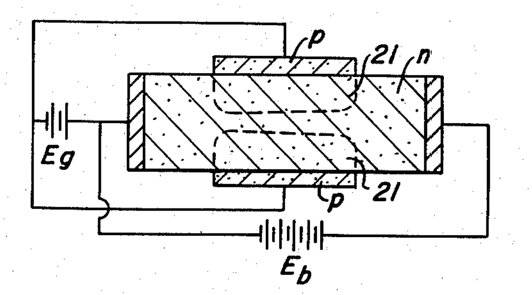
Figure 2 shows another field effect transistor incorporating the invention.
Figure 3:
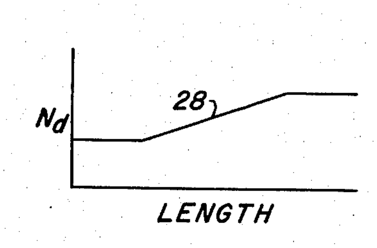
Figure 3 shows a curve of carrier concentration along the channel of the field effect transistor of Figure 2.

It is, of course, apparent to one versed in the art that rather than forming a channel having varying width, the space charge layer 21 may be controlled by varying the doping density along the channel region. Thus, the doping in the channel may be increased toward the drain end as indicated by the sloping line 28 of Figure 3. The net effect is to create space charge regions 21 as shown in Figure 2 which gives an effective channel having the desired configuration. In all other respects the transistor operates as described with reference to that of Figure 1.

Figure 4:
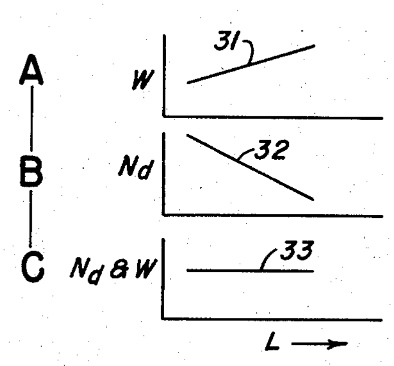
Figures 4A–4C illustrate a field effect transistor incorporating features shown in Figures 1 and 2.

In certain instances it may be desirable to employ a combination of the effects described hereinabove and shown in Figures 1 and 2. Referring to Figure 4A, the channel width is shown increasing to the right by the curve 31. Similarly, the carrier density is shown by the curve 32, Figure 4B, decreasing to the right. The net effect is to give a device having constant carrier density times width as indicated by curve 33, Figure 4C. It is, of course, understood, that these curves are illustrative only and that any desired effective channel configuration may be obtained by controlling the variables discussed.

Figure 5:
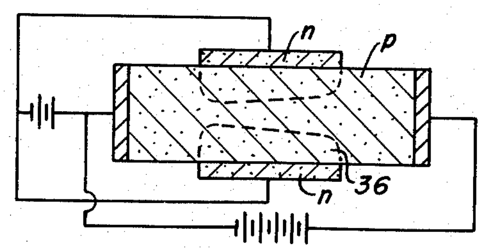
Figure 5 shows a field effect transistor which includes a p-type channel region.

It is apparent, of course, that the invention is not limited to a field effect transistor which includes an n-type channel. Referring particularly to Figure 5, a field effect transistor which includes n-type gates and a p-type channel is illustrated. By suitably varying the carrier density in the p-type channel or by varying the channel width, a space charge or depletion layer configuration of the type shown at 36 may be obtained.

I claim:

1. A field effect transistor comprising a channel region, source and drain connections, and at least one gate, said transistor having an effective channel of substantially uniform width.

2. A field effect transistor comprising a channel region having source and drain connections, and a gate region forming a junction therewith, said gate region having a predetermined configuration and said channel region having a predetermined variation of carrier density whereby an effective channel having substantially constant width is formed.

3. A field effect transistor comprising a channel region having source and drain connections, and a gate region forming a junction therewith, said channel region widening towards the drain end whereby the space charge layer forms an effective channel having substantially uniform width.

4. A field effect transistor comprising a channel region having source and drain connections, and a gate region forming a junction therewith, said channel region having an increasing carrier density towards the drain connection whereby an effective channel having substantially uniform width is formed.

5. A field effect transistor comprising a channel region having source and drain connections, and a gate region forming a junction therewith, said gate region widening towards the drain end and said channel having an increasing carrier density towards the drain end whereby the transistor is pinched off at the source end before it is pinched off at the drain end.

6. A field effect transistor comprising a channel region having source and drain connections, a gate region forming a junction therewith, said gate region having a predetermined configuration and said channel region having a predetermined variation of carrier density, means for applying a voltage to said gate whereby an effective channel having substantially constant width is formed adjacent the same.

7. A field effect transistor comprising a channel region having source and drain connections, a gate region forming a junction therewith, said channel region widening toward the drain, and means for applying a gate voltage to said transistor whereby the space charge layer forms an effective channel having substantially uniform width.

8. A field effect transistor comprising a channel region having source and drain connections, a gate region forming a junction therewith, said channel region having an increasing carrier density toward the drain connection, means for applying a gate voltage to said transistor whereby an effective channel having substantially uniform width is formed.

References Cited in the file of this patent

UNITED STATES PATENTS

| | | |
|---|---|---|
| 2,648,805 | Spenke et al. | Aug. 11, 1953 |
| 2,744,970 | Shockley | May 8, 1956 |
| 2,836,797 | Ozarow | May 27, 1958 |